(12) United States Patent
Kim

(10) Patent No.: US 8,580,598 B2
(45) Date of Patent: Nov. 12, 2013

(54) IMAGE SENSOR AND METHOD OF MANUFACTURING THE SAME

(75) Inventor: Hee Jeen Kim, Chungcheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 0 days.

(21) Appl. No.: 13/495,167

(22) Filed: Jun. 13, 2012

(65) Prior Publication Data

US 2012/0252157 A1 Oct. 4, 2012

Related U.S. Application Data

(62) Division of application No. 11/051,662, filed on Feb. 4, 2005, now Pat. No. 8,203,194.

(30) Foreign Application Priority Data

Feb. 5, 2004 (KR) .................. 10-2004-0007485

(51) Int. Cl.
*H01L 21/00* (2006.01)

(52) U.S. Cl.
USPC 438/57; 257/431; 257/E31.126; 257/E31.127

(58) Field of Classification Search
USPC ........ 438/70, 57; 257/431, E31.126, E31.127
See application file for complete search history.

(56) References Cited

U.S. PATENT DOCUMENTS

| 4,140,545 | A | 2/1979 | Nagao et al. |
| 4,412,900 | A | 11/1983 | Tanaka et al. |
| 5,451,766 | A | 9/1995 | Van Berkel |
| 5,536,950 | A | 7/1996 | Liu et al. |
| 6,011,215 | A | 1/2000 | Glatfelter et al. |
| 6,071,809 | A | 6/2000 | Zhao |
| 6,525,758 | B2 | 2/2003 | Gaudiana et al. |
| 7,306,981 | B2 | 12/2007 | Kuwabara et al. |
| 2001/0028062 | A1 | 10/2001 | Uemura et al. |
| 2002/0130327 | A1 | 9/2002 | Wu et al. |
| 2004/0061126 | A1 | 4/2004 | Imai et al. |
| 2004/0130757 | A1 | 7/2004 | Mabuchi |
| 2004/0140564 | A1 | 7/2004 | Lee et al. |

FOREIGN PATENT DOCUMENTS

| JP | 5766665 | 4/1982 |
| JP | 2000150846 | 5/2000 |
| JP | 200414802 | 1/2004 |
| KR | 20020045868 | 6/2002 |

*Primary Examiner* — Timor Karimy
(74) *Attorney, Agent, or Firm* — McAndrews, Held & Malloy, Ltd.

(57) ABSTRACT

Disclosed are an image sensor and a method of manufacturing the same. A metal wiring consisting of a lower metal wiring, an upper metal wiring, and a plug connecting the lower and upper metal wirings, in which the lower and upper metal wiring are made of a transparent conductive film pattern, is formed on a substrate with devices formed thereon, the devices including a photodiode and gate electrodes. Then, a passivation film, a color filter, and a microlens are sequentially formed on the metal wiring. All or a portion of the metal wiring is formed in a transparent conductive film pattern. As such, the metal wiring is formed on the photodiode.

20 Claims, 6 Drawing Sheets

IMAGE SENSOR AND METHOD OF MANUFACTURING THE SAME

CROSS REFERENCE TO RELATED APPLICATIONS

The present patent application is a divisional of U.S. patent application Ser. No. 11/051,662, filed Feb. 4, 2005, which claims priority to KR Patent Application No. 10-2004-0007485, filed Feb. 5, 2004, each of which is incorporated herein by reference in its entirety.

BACKGROUND OF THE INVENTION

1. Field of the Invention

The present invention relates to a device for converting photons into charge packets, and more particularly to an image sensor with a metal wiring and a method of manufacturing the image sensor.

2. Description of the Prior Art

An image sensor is a device for converting one or two-dimensional optical image into an electrical signal. The image sensor is a kind of a solid-state image sensor which is generally divided into a CMOS (Complementary Metal Oxide Semiconductor) image sensor and a CCD (Charge Coupled Device) image sensor.

The CMOS image sensor converts an optical image into an electrical signal, and employs a switch mode to detect outputs one by one using MOS transistors which are made as many as the number of pixels by use of CMOS manufacturing technique. In particular, the CMOS image sensor has advantages in that a driving mode is simple, various scanning modes can be embodied, and a signal processing circuit can be integrated into a single chip, which can miniaturize a chip. In addition, the CMOS image sensor is inexpensive and consumes a low power, because of utilizing a compatible CMOS technique.

The CMOS image sensor generally includes a pixel array and a peripheral circuit. In particular, the pixel array mainly consists of a photodiode for receiving incident light and a peripheral cell for converting the received light into an electrical signal. The photodiode has to secure a region occupied by the photodiode to receive much light.

In the case of securing the occupied region, there is a problem in that the pixel array is largely sized. In addition, since the region occupied by the pixel array is determined after a peripheral cell region is secured, there is a limitation of reducing a size of the pixel array. Accordingly, a fill factor (i.e., a ratio of the photodiode to the pixel array) is up to 30% at present.

Such as, a conventional CMOS image sensor has some advantages, but it is difficult to enlarge an area to be occupied by the photodiode, which may not obtain an image of high resolution.

SUMMARY OF THE INVENTION

Accordingly, the present invention has been made to solve the above-mentioned problems contained in the prior art, and an object of the present invention is to provide an image sensor capable of enlarging an area to be occupied by a photodiode.

Another of the present invention is to provide a method of manufacturing an image sensor of which an area occupied by a photodiode can be easily enlarged.

In order to accomplish this object, there is provided an image sensor comprising: a substrate with devices formed thereon, the devices including a photodiode and gate electrodes; a metal wiring of a transparent conductive material formed on the substrate for transferring signals of the devices to a circuit; a passivation film formed on the metal wiring for protecting the devices; a color filter formed on the passivation film for embodying an image; and a microlens formed on the color filter for collecting light.

According to another aspect of the present invention, there is provided a method of manufacturing an image sensor comprising the steps of: forming devices including a photodiode and gate electrodes on a substrate; forming a lower metal wiring of a transparent conductive film pattern on the substrate to transfer signals of the devices to a circuit; forming a plug formed on the lower metal wiring, the plug being connected to the lower metal wiring; forming an upper metal wiring of a transparent conductive film pattern on the plug, the upper metal wiring being connected to the plug; forming a passivation film on the upper metal wiring; and forming a color filter and a microlens on the passivation film.

With the present invention, all or a portion of the metal wiring consisting of the lower metal wiring, the plug, and the upper metal wiring is formed in a transparent conductive film pattern. As such, the metal wiring can be formed on the photodiode, so that the area occupied by the photodiode can be easily enlarged. That is, the metal wiring of the transparent conductive film pattern is employed, which does not impede transfer of light to the photodiode.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
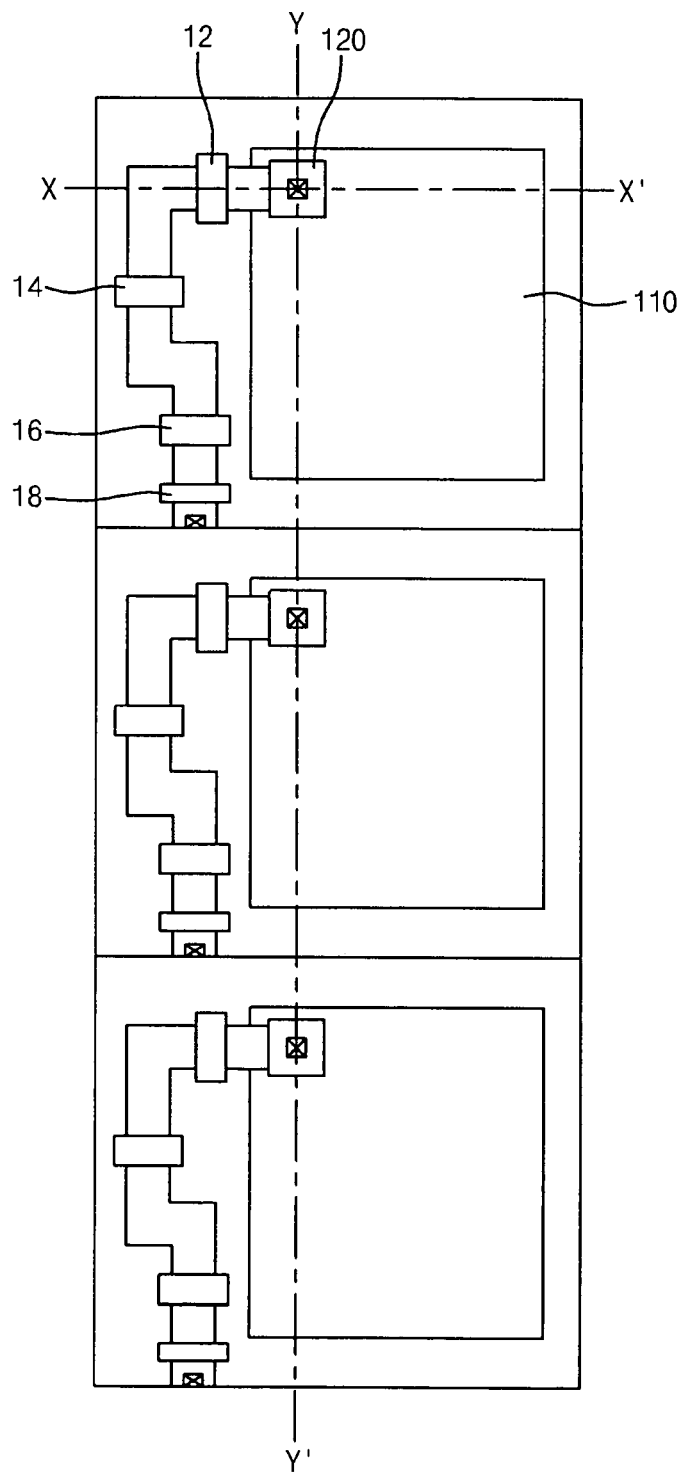
FIG. 1 is a schematic view depicting a layout of a pixel array of an image sensor according to a preferred embodiment of the present invention.

Hereinafter, a preferred embodiment of the present invention will be described with reference to the accompanying drawings. In the following description and drawings, the same reference numerals are used to designate the same or similar components, and so repetition of the description on the same or similar components will be omitted.

FIG. 1 is a schematic view depicting a layout of a pixel array of an image sensor according to a preferred embodiment of the present invention.

Referring to FIG. 1, a pixel diode includes a photodiode for detecting light and four transistors, which form a unit pixel. Among four transistors, a transfer transistor 12 is to transfer a charge stored in the photodiode to a floating diffusion region, a reset transistor 14 is to reset the floating diffusion region as a supply voltage level, a drive transistor 16 serves as a source follower, and a selection transistor 18 is to receive a pixel data enable signal and output a pixel data signal.

The pixel array is designed with a metal wiring 20 for transferring a signal to the device. The metal wiring 20 may be designed on the photodiode 10. The reason is because the metal wiring 20 is made of a pattern of a transparent conductive film consisting of a transparent conductive material.

More specifically, since the metal wiring 20 does not impede when the photodiode 10 receives the light, the metal wiring 20 may be formed on the photodiode 10.

Accordingly, it is possible to easily enlarge an area occupied by the photodiode 10 in the pixel array. In practice, a ratio of the photodiode to the pixel array can be increased by above 50%.

A process of manufacturing the image sensor made of the transparent conductive film according to the present invention will now be described.

Devices containing photodiodes and gate electrodes are formed on a substrate. More specifically, a device isolation film is formed on the substrate. At that time, a trench isolation film is selected as the device isolation film. Then, the photodiodes and the gate electrodes are formed on the substrate. At that time, the gate electrode is formed as a transistor. An interlayer insulation layer is formed on the substrate, and then the substrate is subjected to a contact forming process to achieve an electric connection.

After the devices on the substrate, a process of forming a metal wiring is implemented with respect to the substrate. More specifically, a transparent conductive film of a transparent conductive material is formed on the substrate. The transparent conductive material is selected from InO, SnO, ZnO, MgO, or the like. Any one of the above materials is preferably selected, but a mixture of at least two elements may be utilized. In the case of the transparent conductive film of the transparent conductive material, a single film is preferably formed on the substrate, but at least two films may be formed thereon. For example, the transparent conductive film may be composed of a first InO film and a second SnO film. The transparent conductive film is patterned to form a transparent conductive film pattern and thereby form a metal wiring. More specifically, after forming the transparent conductive film, the substrate is subjected to an oxygen plasma process or a thermal annealing process under an oxygen atmosphere, so as to form the metal wiring. The oxygen plasma process is preferably implemented under conditions of a pressure of 5 to $10^{-5}$ Torr and a power of 100 to 1,000 W. The thermal annealing process is preferably implemented at a temperature of about 350 to 600° C.

The metal wiring consists of a lower metal wiring, an upper metal wiring, and a plug for connecting the lower and upper metal wirings. Accordingly, after forming the lower metal wiring of the transparent conductive film pattern the above process, the plug connected to the lower metal wiring is formed, and then the upper metal wiring connected to the upper metal wiring is formed, thereby completing the metal wiring. At that time, the upper metal wiring may be formed by the same process as that of the lower metal wiring. Preferably, the plug is a tungsten plug, and may be made of a transparent conductive material. Preferably, an interlayer insulation film pattern is interposed between the lower metal wiring and the upper metal wiring so as to form the plug.

After forming the metal wiring, a passivation film is formed on the metal wiring so as to protect the underlaid devices from being subjected to the external environments. Then, a color filter is formed on the passivation film to embody an image. At that time, the color filter mainly consists of red R, green G, and blue B. A microlens is formed on the color filter to collect incident light.

Figure 2:
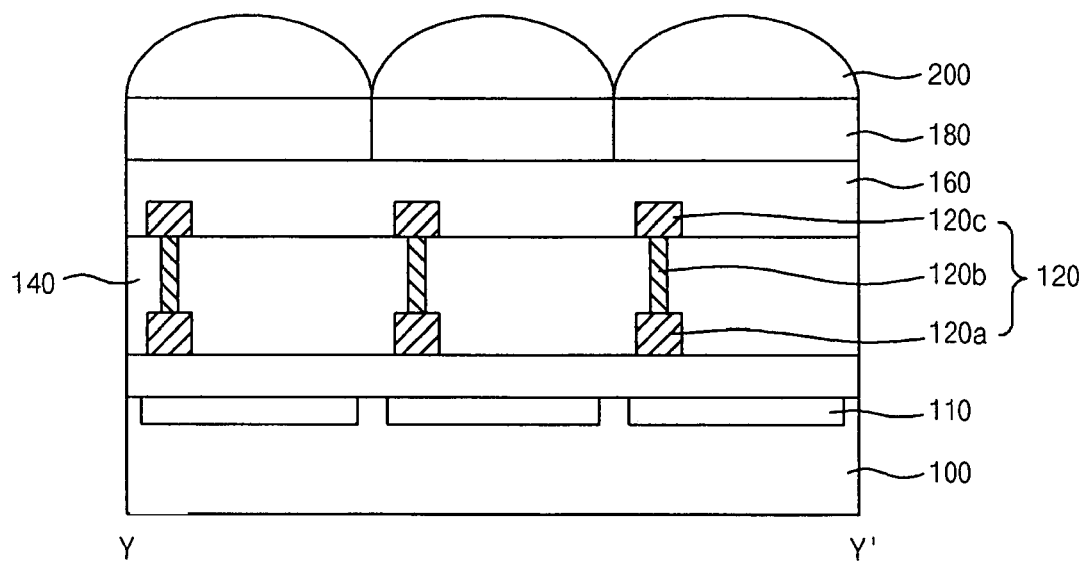
FIG. 2 is a cross-sectional view of an image sensor according to a preferred embodiment of the present invention.

As such, the image sensor according to the present invention includes, as shown in FIG. 2, a substrate 100 with devices consisting of photodiodes and gate electrodes formed thereon, a metal wiring 120 of a transparent material formed on the substrate 100, a passivation film 160 formed on the metal wiring 120, a color filter 180 formed on the passivation film 160, and a microlens 200 formed on the color filter 180. The metal wiring 120 consists of a lower metal wiring 120a, a plug 120b, and an upper metal wiring 120c. In particular, because of the plug 120b, an interlayer insulation film pattern 140 is interposed between the lower metal wiring 120a and the upper metal wiring 120c.

As such, the image sensor of the present invention includes the metal wiring 120 made of the transparent conductive material. The reason why the metal wiring 120 is formed on the photodiode is because the metal wiring 120 does not block the light incident onto the photodiode. Accordingly, the area occupied by the photodiode can be enlarged. Increased ratio of the photodiode to the pixel array may allow an image of a high resolution to obtain.

A process of manufacturing the image sensor according to one preferred embodiment of the present invention will now be described in detail with reference to the accompanying drawings.

FIGS. 3A through 3F are cross-sectional views depicting a process of manufacturing an image sensor according to a preferred embodiment of the present invention.

Figure 3A:
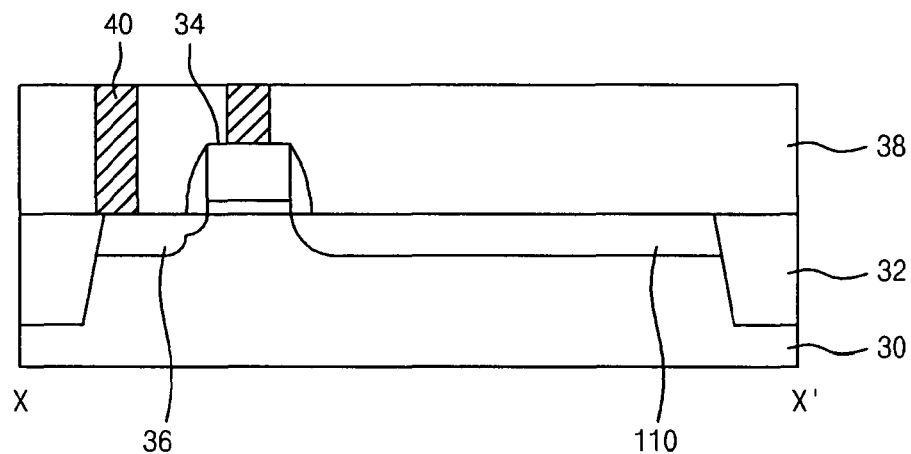
FIGS. 3A through 3F are cross-sectional views depicting a process of manufacturing an image sensor according to a preferred embodiment of the present invention.

Referring to FIG. 3A, devices are formed on a substrate through a front-end-of-line (FEOL) process. First of all, a transistor consisting of a gate electrode 32 and a source/drain electrodes 36a and 36b is formed on the substrate. An interlayer insulation film pattern 40 having a contact hall is formed on the substrate 30 with the transistor formed thereon, and a tungsten plug 34 is formed in the contact hall. As a result, the substrate 30 including the devices having the photodiode and the gate electrode 32 of the transistor has been provided.

Figure 3B:
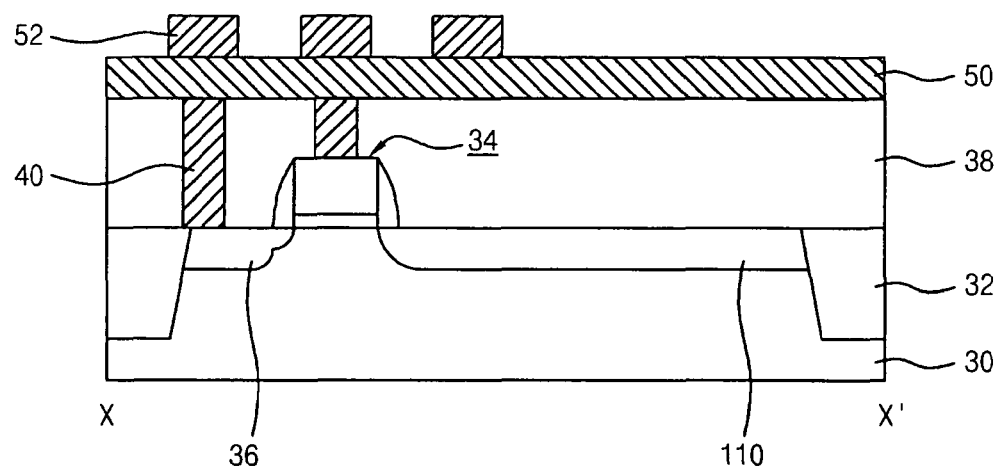
Figure 3C:
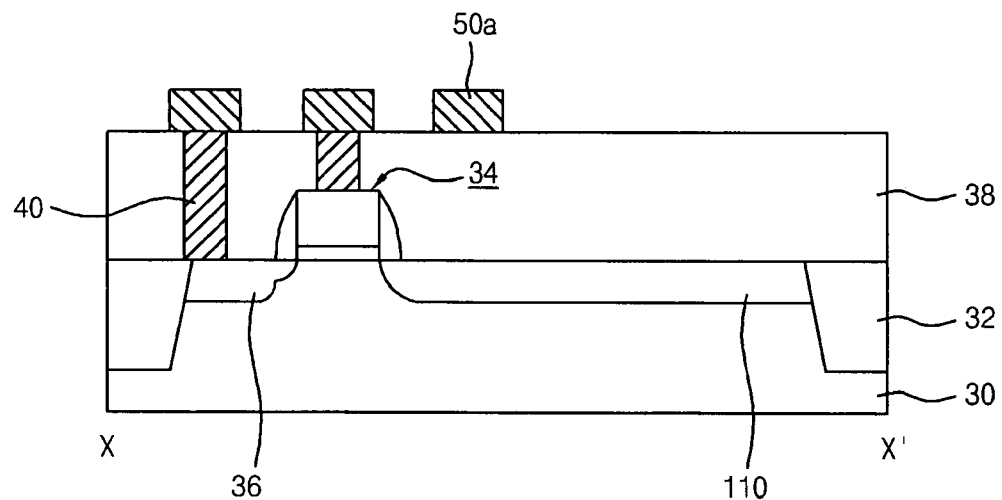
Figure 3D:
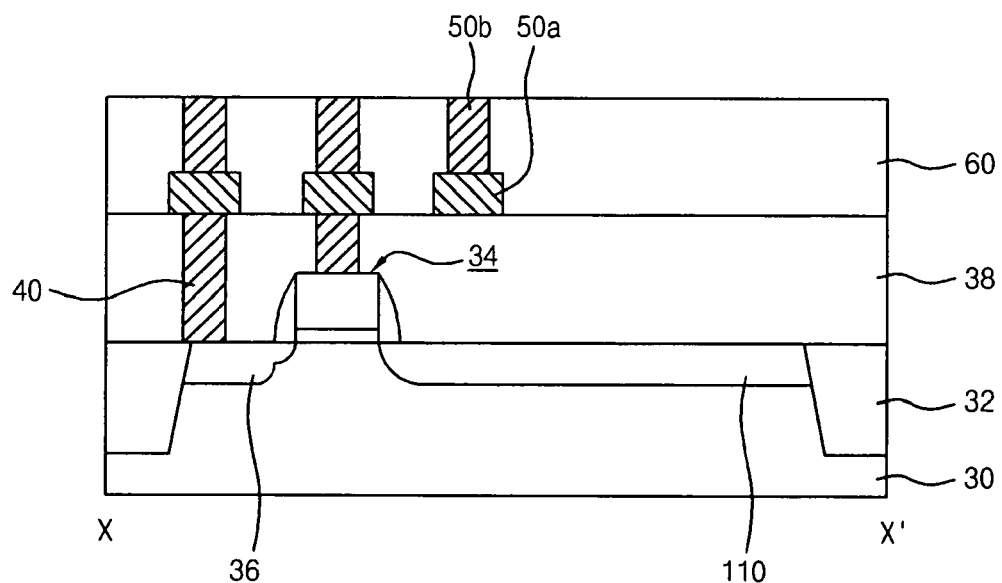

Referring to FIGS. 3B and 3C, a lower metal wiring 50a is formed on the substrate 30 with the devices formed thereon. More specifically, a transparent conductive film 50 of $In_2O_3$ is formed on the substrate 30. The transparent conductive film 50 may be formed by layering $In_2$ on the substrate through sputtering and then oxidizing a surface of the $In_2$ layer through an oxygen plasma process. At that time, the oxygen plasma is implemented under conditions of a pressure of about 5 Torr and a power of about 500 W. For the thermal annealing process, it is preferably implemented at a temperature of about 350 to 600° C. The transparent conductive film 50 of $In_2O_3$ is formed on the substrate 30 through lamination and surface oxidization. Then, a photoresist film is formed on the transparent conductive film 50, and then is subjected to a photolithography etching process to form a photoresist pattern 52. The substrate is etched using the photoresist pattern 52 as an etching mask to form the lower metal wiring 50a of the transparent conductive film pattern. At that time, the etching is implemented by wet etching, in which it uses an etching solution mixed with HCl and $H_2O$ at a ratio of 1:1, and the substrate is immersed into the etching solution at about 50° C. during about 1 minute Referring to FIG. 3D, an interlayer insulation film is formed on the substrate 30 with the lower metal wiring 50a formed thereon. At that time, an oxide film is generally selected as the interlayer insulation film. The interlayer insulation film is patterned to form an interlayer insulation film pattern 60 having a via hole. A plug 50b of tungsten is formed in the via hole of the interlayer insulation film pattern 60. Formation of the plug 50b is achieved by lamination and polishing. More specifically, after tungsten film is formed on the interlayer insulation film pattern 60 in such a way that the tungsten is sufficiently buried in the via hole, the tungsten film is polished until a surface of the interlayer insulation film pattern 60 is exposed, thereby obtaining the plug 50b.

Figure 3E:
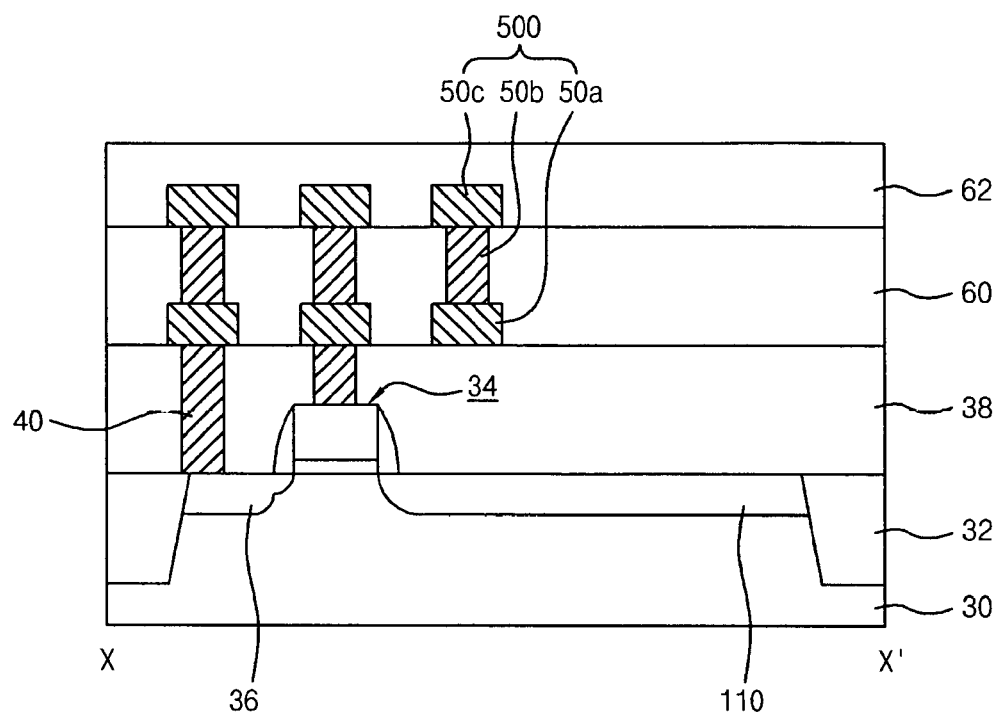

Referring to FIG. 3E, an upper metal wiring 50c to be connected to the plug 50b is formed on the substrate. The upper metal wiring 50c is formed by the same process as that of the lower metal wiring 50a. That is, a transparent conductive film is formed on the substrate, and then is patterned to form the upper metal wiring 50c of a transparent conductive film pattern.

As a result, a metal wiring 500 consisting of the lower metal wiring 50a, the upper metal wiring 50c, and the plug 50b connecting the wirings 50a and 50c is formed on the substrate 30.

A passivation film 62 is formed on the substrate 30 with the metal wiring 500 formed thereon. The passivation film 62 is to protect the metal wiring 500 and the devices formed on the substrate from being permeated with moisture or being scratched. At that time, an oxide film is generally selected as the passivation film 62.

Figure 3F:
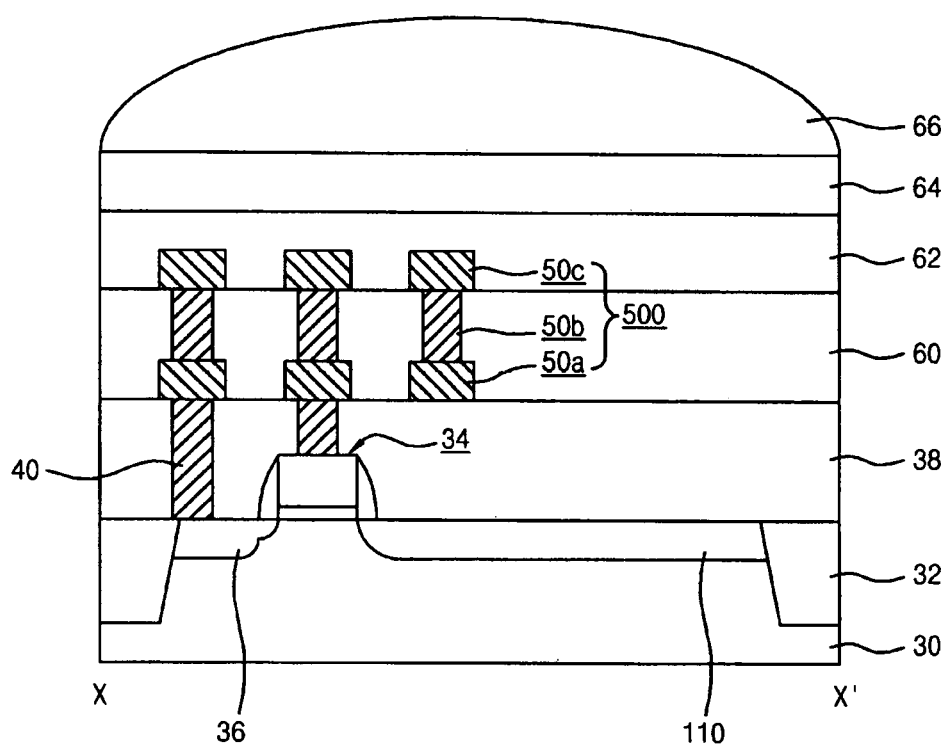

Referring to FIG. 3F, a color filter 64 consisting of red, green, and blue is formed on the passivation film 62. The color filter 64 is formed through three times of lamination and three times of etching. More specifically, a layer forming red is firstly layered and etched, then a layer forming green is layered and etched, and a layer forming red is finally layered and etched.

A microlens 66 is formed on the color filter 64. At that time, the microlens 66 is formed in a semi-spherical shape so as to improve an efficiency of collecting the light.

As such, the image sensor consisting of the metal wiring 500, the color filter 64, and the microlens 66 is formed on the substrate. The metal wiring 500 can be formed on the photodiode, so that the area occupied by the photodiode can be enlarged.

With the above description, according to the present invention, the metal wiring can be formed on the photodiode, so that the area occupied by the photodiode can be easily enlarged. Therefore, an image sensor having a high resolution can be obtained by increasing a ratio of the photodiode to a pixel array.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method, comprising:
   forming a plurality of devices, including a photodiode, in a substrate;
   forming a lower metal wiring, including a lower transparent conductive film pattern, on the substrate such that the lower metal wiring overlaps the photodiode and is coupled to one of the plurality of devices;
   forming a plug such that the plug overlaps the photodiode and is coupled to the lower metal wiring;
   forming an upper metal wiring, including an upper transparent conductive film pattern, such that the upper metal wiring overlaps the photodiode and is coupled to the plug;
   forming a passivation film on the upper metal wiring; and
   forming a color filter and a microlens on the passivation film.

2. The method of claim 1, wherein said forming a lower metal wiring comprises forming the lower transparent conductive film pattern from a material selected from the group consisting of InO, SnO, ZnO, and MgO.

3. The method of claim 1, wherein said forming a lower metal wiring comprises:
   layering a transparent conductive film of a transparent conductive material; and
   performing an oxygen plasma process at a pressure of 5 to $10^{-5}$ Torr and a power of 100 to 1,000 W.

4. The method of claim 1, wherein said forming a lower metal wiring comprises:
   layering a transparent conductive film of a transparent conductive material; and
   performing a thermal annealing at a temperature of 350 to 600° C. under an atmosphere of oxygen gas.

5. The method of claim 1, wherein said forming a plug comprises forming the plug from tungsten.

6. The method of claim 1, wherein said forming a plug comprises forming the plug from a material selected from the group consisting of InO, SnO, ZnO, and MgO.

7. A method, comprising:
   forming a photodiode in a substrate;
   forming a first transparent wiring over the substrate such that the first transparent wiring overlaps at least a first portion of the photodiode;
   forming an interlayer insulation film over the first transparent wiring;
   forming a transparent conductive plug through the interlayer insulation film and coupled to the first transparent wiring such that the transparent conductive plug overlaps at least a second portion of the photodiode; and
   forming a second transparent wiring over the interlayer insulation film and coupled to the transparent conductive plug such that the second transparent wiring overlaps at least a third portion of the photodiode.

8. The method of claim 7, wherein said forming a first transparent wiring comprises forming the first transparent wiring from a material selected from the group consisting of InO, SnO, ZnO, and MgO.

9. The method of claim 8, wherein said forming a first transparent wiring comprises:
   layering a transparent conductive film of a transparent conductive material; and
   performing an oxygen plasma process at a pressure of 5 to $10^{-5}$ Torr and a power of 100 to 1,000 W.

10. The method of claim 7, wherein said forming a second transparent wiring comprises:
    layering a transparent conductive film of a transparent conductive material; and
    performing a thermal annealing at a temperature of 350 to 600° C. under an atmosphere of oxygen gas.

11. The method of claim 7, wherein said forming a plug comprises forming the plug from tungsten.

12. The method of claim 7, wherein said forming a plug comprises forming the plug from a material selected from the group consisting of InO, SnO, ZnO, and MgO.

13. A method, comprising:
    forming a photodiode in a substrate; and
    forming a transparent conductive wiring structure over the substrate such that the transparent conductive wiring structure overlaps at least a portion of the photodiode, wherein the transparent conductive wiring structure includes a first transparent wiring, a second transparent wiring, and a transparent conductive plug that couples the first transparent wiring to the second transparent wiring.

14. The method of claim 13, further comprising:
    forming a passivation film over the transparent conductive wiring structure; and
    forming a color filter and a microlens on the passivation film.

15. The method of claim 13, wherein said forming a transparent conductive wiring structure comprises forming the first transparent wiring, the transparent plug, and the second transparent wiring such that each of the first transparent wiring, the transparent plug, and the second transparent wiring overlaps the photodiode.

16. The method of claim 13, wherein said forming a transparent conductive wiring structure comprises forming the transparent conductive wiring structure from a material selected from the group consisting of InO, SnO, ZnO, and MgO.

17. The method of claim 13, wherein said forming a transparent conductive wiring structure comprises:
   layering a transparent conductive film of a transparent conductive material; and
   performing an oxygen plasma process at a pressure of 5 to $10^{-5}$ Torr and a power of 100 to 1,000 W.

18. The method of claim 13, wherein said forming a transparent conductive wiring structure comprises:
   layering a transparent conductive film of a transparent conductive material; and
   performing a thermal annealing at a temperature of 350 to 600° C. under an atmosphere of oxygen gas.

19. The method of claim 13, wherein said forming a transparent conductive wiring structure comprises forming the transparent conductive plug from tungsten.

20. The method of claim 13, wherein said forming a transparent conductive wiring structure comprises forming the transparent conductive plug from a material selected from the group consisting of InO, SnO, ZnO, and MgO.

\* \* \* \* \*

UNITED STATES PATENT AND TRADEMARK OFFICE
CERTIFICATE OF CORRECTION

| | | |
|---|---|---|
| PATENT NO. | : 8,580,598 B2 | Page 1 of 1 |
| APPLICATION NO. | : 13/495167 | |
| DATED | : November 12, 2013 | |
| INVENTOR(S) | : Kim | |

It is certified that error appears in the above-identified patent and that said Letters Patent is hereby corrected as shown below:

In the Specification

In Column 2, Line 55, delete "photodiode" and insert -- photodiode 10 --, therefor.

In Column 4, Line 52, delete "minute" and insert -- minute. --, therefor.

In Column 4, Line 61, delete "after tungsten" and insert -- after a tungsten --, therefor.

In the Claims

In Column 6, Line 9, in Claim 5, delete "plug" and insert -- transparent plug --, therefor.

In Column 6, Line 11, in Claim 6, delete "plug" and insert -- transparent plug --, therefor.

Signed and Sealed this
Thirteenth Day of May, 2014

Michelle K. Lee
*Deputy Director of the United States Patent and Trademark Office*